United States Patent
Swab

(10) Patent No.: US 7,552,527 B2
(45) Date of Patent: Jun. 30, 2009

(54) NON-CONTACT INTERFACE FOR PICK-AND-PLACE MACHINES

(75) Inventor: Michael T. Swab, Acworth, GA (US)

(73) Assignee: Assembleon N.V., La Veldhoven (NL)

( * ) Notice: Subject to any disclaimer, the term of this patent is extended or adjusted under 35 U.S.C. 154(b) by 61 days.

(21) Appl. No.: 11/298,937

(22) Filed: Dec. 12, 2005

(65) Prior Publication Data

US 2006/0196045 A1    Sep. 7, 2006

Related U.S. Application Data

(60) Provisional application No. 60/635,682, filed on Dec. 13, 2004.

(51) Int. Cl.
  *B23P 19/00*  (2006.01)
  *G06F 7/00*  (2006.01)

(52) U.S. Cl. ............... 29/740; 29/739; 29/759; 700/229

(58) Field of Classification Search ............ 29/729, 29/740, 759, 739; 700/229
See application file for complete search history.

(56) References Cited

U.S. PATENT DOCUMENTS

| | | | |
|---|---|---|---|
| 3,705,986 A | 12/1972 | Sanders et al. | |
| 5,377,405 A * | 1/1995 | Sakurai et al. | 29/833 |
| 6,032,845 A * | 3/2000 | Piccone et al. | 226/139 |
| 6,048,750 A * | 4/2000 | Hembree | 438/107 |
| 6,195,165 B1 * | 2/2001 | Sayegh | 356/613 |
| 6,211,960 B1 * | 4/2001 | Hembree | 356/400 |
| 6,353,693 B1 | 3/2002 | Kano et al. | |
| 6,490,787 B1 * | 12/2002 | Ohashi et al. | 29/833 |
| 6,559,464 B1 * | 5/2003 | Flanders et al. | 250/548 |
| 6,590,658 B2 * | 7/2003 | Case et al. | 356/401 |
| 6,608,320 B1 * | 8/2003 | Skunes et al. | 250/559.19 |
| 6,762,847 B2 * | 7/2004 | Duquette et al. | 356/614 |
| 7,389,920 B2 * | 6/2008 | Rodgers | 235/385 |
| 2002/0062170 A1 * | 5/2002 | Skunes et al. | 700/229 |

FOREIGN PATENT DOCUMENTS

WO    WO 01/03489 A1    1/2001

* cited by examiner

*Primary Examiner*—C. J Arbes
(74) *Attorney, Agent, or Firm*—Foley & Lardner LLP

(57) ABSTRACT

In an for controlling a feeder or feeder cart used in a pick-and-place electronics assembly machine, non-physical contact transmitters and receivers transfer data, such as feeder trigger signals, feeder ready signals, and component identification and usage information, between the feeder and/or feeder cart and the pick-and-place machine. Wiring or other physical connections between feeder, feeder cart, and pick-and-place machine controls are not required. A common, universal interface between different types of feeders, feeder carts, and pick-and-place machines is possible.

12 Claims, 2 Drawing Sheets

NON-CONTACT INTERFACE FOR PICK-AND-PLACE MACHINES

CROSS-REFERENCE TO RELATED APPLICATIONS

This application claims priority to, and hereby incorporates by reference in its entirety, U.S. Provisional Patent Application No. 60/635,682, which was filed on Dec. 13, 2004.

BACKGROUND

The present invention relates generally to controls for systems of surface mount machines and their auxiliary equipment, and more particularly, to a system and method for a control system interface between feeder exchange systems or feeders and surface mount machines.

Surface Mount Technology ("SMT") is used to assemble printed circuit boards ("PCB's") by mounting components on a surface of the boards. Commercial pick-and-place machines are commonly used to automate SMT processes, often under computer control, and to assure that components are placed at their proper positions on PCB's.

A feeder is used to supply a surface mountable component to a pick-up head of a pick-and-place machine, which then places the component on a PCB. Feeder devices may be microprocessor controlled and may use mechanical or pneumatic conveyors, pneumatic cylinders, pneumatic valves or electrical motors, among other devices, to move components from the feeder device to the pick-up head.

Many types of feeder are available and may be used, depending on, among other things, the specifications of the pick-and-place machine and the components being handled. Tape, stick, bulk, and tray feeders are common types. In tape feeders, for example, components are packed on a tape and released to the pick-up head as the tape passes through the feeder. Stick feeders release components from sticks or tubes, often by vibrating the stick or tube or by releasing compressed air to slide a component from the stick or tube and send it in a desired direction.

Feeder auxiliaries and components to be mounted on PCB's may be placed on carts or trolleys. A feeder exchange system ("FES"), for example, often includes a feeder exchange cart, trolley, and other devices designed to provide seamless integration of feeders to surface mount machines, by, among other functions, automatically replenishing the supply of components to the feeder. If components for the next production run are kept on hand and rapidly connected to a pick-and-place machine at the end of a production run, the time between production runs may be reduced to a matter of minutes.

Many commercially available feeders, FES's and other auxiliaries are adaptable to the many different models of pick-and-place machines, being able, for example, with respect to feeders, to accommodate differences in clearances, pick point location and mounting design, in particular, differences between the more common models of pick-and-place equipment from manufacturers such as Fuji, Panasonic, Sanyo, Siemens, Universal, Zevatech, TDK, Philips, Quad, Intelliplace, Samsung, Mamiya and Tenryu.

Currently, however, control and operating data is transferred between surface mount machines and their auxiliary equipment via hard electrical contacts or through another, physical connection.

In WO0103489 A1 an optical waveguide and optical transmitter and receiver serve as a communication link between a control unit of a pick-and-place machine and a control unit of a feeder unit, thereby avoiding a cable connection that must otherwise transmit information in a fixed grid pattern or raster. The feeder may be coupled to any position on the optical waveguide, which serves as a bi-directional bus.

Non-physical contact (e.g., optical) data communications systems are well known in communications and data processing. For example, U.S. Pat. No. 3,705,986 to Sanders et al. discloses a point-to-point digital data transmission system employing pulse modulated infrared or light beams in which a pair of optical transceiver units link one computer installation to another via line of sight communications.

U.S. Pat. No. 6,353,693 to Kane et al. discloses an optical connection used within a pick-and-place machine. A pair of optical couplers are interposed between a stator and a rotor in a slip ring unit of an electronic component-mounting apparatus for permitting bi-directional communication between a stator-side circuit and a rotor-side circuit.

A non-physical contact interface may also be accomplished using RF signals. Radio frequency identification tags are in use by, for example, Yamaha IM Company to transmit the serial number of a feeder auxiliary to a control system of a pick-and-place machine by close proximity RF transmission.

Transmit/receive modules using non-physical contact coupling such as RF or optical coupling, for example, Agilent Technologies' HSDL-3200 infrared transceiver module, which has a small size and a link distance of 20-30 cm, are commercially available and readily adapted to use in SMT.

A principal disadvantage associated with conventional feeders and other pick-and-place machine auxiliary devices, is that the controllers for these feeder mechanisms must for an acceptable level of functionality each be mechanically connected, by a waveguide or by an instrument cable. A cable may carry as many as sixty signal lines, to a surface mount machine or a feeder. A cable, in particular, must match the particular feeder device with the particular placement machine. The physical layout of hard electrical contacts is unique between, for example, different types of feeders/ feeder carts and pick-and-place machines.

It is, therefore, highly desirable to have an efficient and effective means of automatically interfacing feeder mechanisms to various pick-and-place machines, thereby eliminating the need to connect, disconnect, and reconnect instrumentation cables during operation of surface mount machines and their ancillary equipment.

SUMMARY

In light of the foregoing, it is desired to provide a method of using non-physical contact communications to transfer data to and from a pick-and-place electronics assembly machine and a feeder, feeder cart, or other auxiliary used in conjunction with the pick-and-place machine. It is also desired to provide a device for data transfer between a feeder and/or feeder cart or other auxiliary and a pick-and-place machine, without the need for an instrument cable connecting the pick-and-place machine and the feeder and/or feeder cart or other auxiliary. It is further desired to provide a structure and method for implementing a common, universal interface between different types of feeders, feeder carts and pick-and-place machines.

These and other objects of the present invention are accomplished by a method and apparatus using a non-physical contact communications link to transfer data to and from a pick-and-place machine, feeder, feeder cart, FES or other auxiliary equipment used with a pick-and-place electronics assembly machine as described herein. This method uses a link, such as an RF or optical transmitter/receivers. The link does not require physical contact to transfer data between, for example, a feeder, feeder cart, and/or FES and the pick-and-place machine. The link uses such as a beam of radiant energy, preferably RF radiation, visible or infrared light. The data may include feeder trigger signals, feeder ready signals, component ID, and/or usage information. The invention permits a non-physical contact, generalized method of transferring signals from, for example, a feeder to a feeder cart and from the feeder cart to the main machine.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present invention will become apparent from the following description, appended claims, and the accompanying exemplary embodiments shown in the drawings, which are briefly described below.

DETAILED DESCRIPTION

Figure 1:
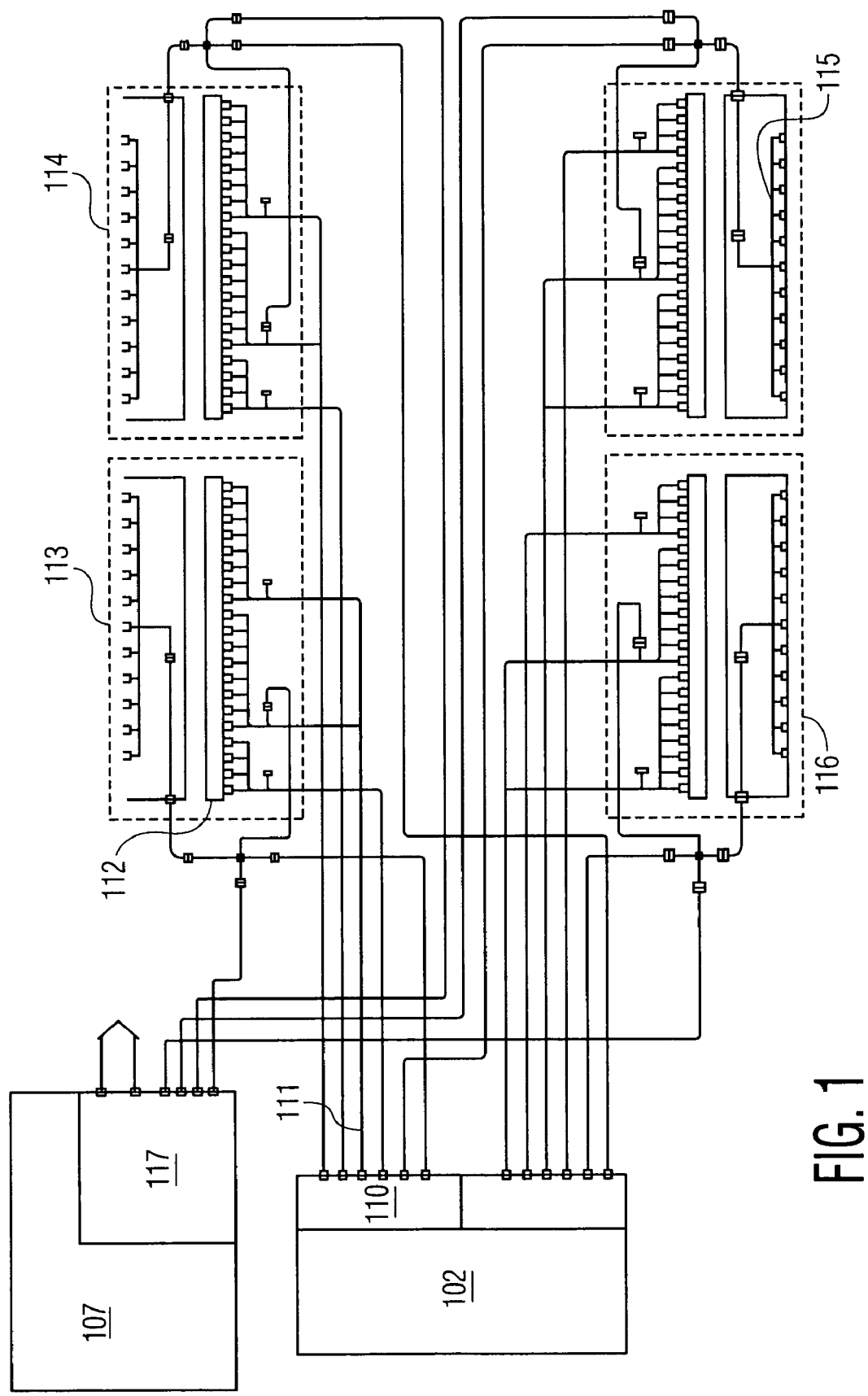
FIG. 1 is a schematic diagram that shows a conventional set of cable connections between feeders and an SMT machine.

Efforts have been made throughout the drawings to use the same or similar reference numerals for the same or like components.

FIG. 1 is a schematic diagram that shows a conventional cable connection between a pick-and-place machine and an FES. An I/O converter 110 of a pick-and-place machine control system 102 is physically connected by a number of instrument leads 111 to solenoid valves 112 of first stick feeder controls 113. Other leads are connected in the same way to second, third and fourth stick feeder controls 114, 115 and 116. The FES has an FES control system 107, which has an FES feeder stick control ASIC 117. The FES is specific to each type of feeder. The FES control system 107 controls the operation of the feeder of the pick-and-place machine and pulls data from the feeder.

The amount of data exchanged between the units shown in FIG. 1 is relatively small. The present invention is not, however, so limited and can accommodate the increasing demands for exchange of data between and among parts of SMT systems.

In the present invention, the flow of data is as follows: from a mounter of the pick-and-place machine the signal is sent to operate an auxiliary, for example, a feeder cart. A multiplexer on the mounter side of a non-physical contact interface encodes the signal and sends it to a transmitter using a non-physical contact means for transmission such as RF or infrared or visible light. The signal is transmitted to the cart via the non-physical contact means. The receiver on the cart sends the signal to a demultiplexer. The demultiplexer decodes the signal and, based on the type of feeder, operates the required valves or solenoids on the feeder to advance the part. The only part of the system that changes with a change in the feeder type is the section after the demultiplexer on the feeder cart.

Figure 2:
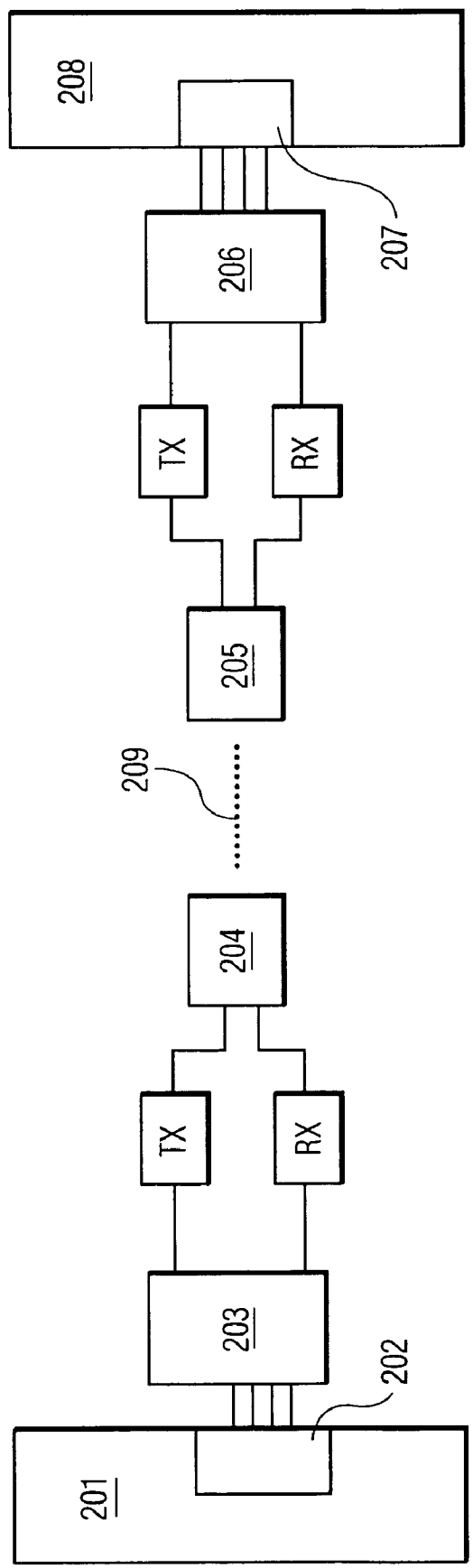
FIG. 2 is a block diagram of an optical non-physical contact interface for a pick-and-place machine in accordance with the present invention.

An exemplary embodiment of the present invention using an optical non-physical contact interface is illustrated in FIG. 2. A pick-and-place machine 201 has a pick-and-place machine control system 202 that is optically coupled with an FES 208 that has an FES control system 207. The pick-and-place machine control system 202 is typically a complex system using pneumatics, hydraulics, air or electric driven motors, solenoids and similar devices under the control of one or more microprocessors. Communication is between a pick-and-place machine optical transmit-receive module 204 and an FES optical transmit-receive module 205 through an optical (i.e., non-physical) contact interface 209, i.e., without instrument cable, waveguide or other physical link between the FES 208 and pick-and-place machine 201.

Each optical transmit-receive module 204, 205 has one or more optical sources that function as optical transmitters and one or more optical detectors that function as optical receivers to form an optical (i.e., non-physical contact) coupler with a corresponding optical detector or optical source of the other optical transmit receive module 205, 204. An optical source, which may be a light emitting diode ("LED") or a laser, is modulated by a stream of digital data to transmit pulses of radiant energy, typically visible or infrared light. The detectors may be any kind of photodetector that is capable of receiving and converting the radiant energy pulses into a stream of digital data.

The pick-and-place machine control system 202 and FES control system 207 are connected, respectively, to a pick-and-place machine interface unit 203 and an FES interface unit 206. A multiplexer in the pick-and-place machine interface unit 203 combines various signals from the pick-and-place machine control system 202 for transmission over a single medium to the optical transmit/receive module 204. A demultiplexer in the pick-and-place machine interface unit 203 separates multiplexed signals received from the pick-and-place machine optical transmit/receive module 204 to a set of discrete data points that are transmitted to the pick-and-place machine control system 202.

Similarly, the FES interface unit 206 has a multiplexer/demultiplexer that combines various signals from the FES control system 207 for transmission over a single medium to the optical transmit/receive module 205. A demultiplexer in the FES interface unit 206 separates multiplexed signals received from the FES optical transmit/receive module 205 to a set of discrete data points that are transmitted to a processor or directly to relays, solenoid valves or other components of the FES control system 207.

Alternatively, a multiplexer/demultiplexer may be a part of the optical transmit/receive module 204 or the transmit/receive module 205.

The FES control system 207 may have a programmable logic controller ("PLC"), sensors and systems for releasing components to the pick-and-place machine. The FES control system 207 can, however, be much simpler, comprising, for example, only electrical and electromechanical sensors and interlocks, without a PLC or other microprocessor based controller. The FES control system 207 may, for example, have a controller to control solenoid valves to allow pulsed air blasts through an air outlet to agitate components in a hopper, thereby allowing one or more components to drop into position for mounting on a PCB.

In a second embodiment the pick-and-place machine 201 is interfaced directly with a feeder. A feeder is typically a self-contained electropneumatic mechanical apparatus. The feeder operating cycle may be adjusted by a PLC to be compatible with pick-and-place machines supplied by different manufacturers. The timing of the sequence of steps executed by the feeder device, as well as the positioning of the feeder to align the pick-up point with the pick-up arm of the pick-andplace machine, is determined by the PLC from data detecting sensors of the feeder control system. The sensed data may, for example, be from optical sensors that detect the arrival of the pick-up arm.

The present invention allows the mounting machine side of an interface to transmit and receive a standard set of signals. For example, when a feeder in a given location needs to be advanced, the mounter would simply toggle on the bit for that feeder. If the feeder is a electro-pneumatic type, such as those manufactured and sold by Assembléon and Yamaha IM Company, the signal would be received by the cart and a 12V DC signal would be sent to the feeder to activate the air valve. If the feeder were a UIC feeder, then the cart would receive the same signal from the mounter and then supply a 24V DC signal to the feeder.

Finally, the aforementioned discussion is intended to be merely illustrative of the present invention and should not be construed as limiting the appended claims to any particular embodiment or group of embodiments. Each of the systems utilized may also be utilized in conjunction with further systems. Thus, while the present invention has been described in particular detail with reference to specific exemplary embodiments thereof, it should also be appreciated that numerous modifications and changes may be made thereto without departing from the broader and intended spirit and scope of the invention as set forth in the claims that follow. For example, in addition to feeders, the present invention may be practiced with many other auxiliaries for pick-and-place machines such as devices for bar code verification of part numbers, monitoring equipment and automatic nozzle changing devices. The specification and drawings are accordingly to be regarded in an illustrative manner and are not intended to limit the scope of the appended claims.

In light of the foregoing, the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

What is claimed is:

1. An SMT system comprising:
   a pick-and-place machine;
   a pick-and-place machine auxiliary;
   a first transmit and receive module that has a physical connection to a control system of the pick-and-place machine auxiliary; and
   a second transmit and receive module that has a physical connection to a pick-and-place machine control system,
   wherein the first and second transmit and receive modules are configured to use a non-physical contact communications link to transfer data back and forth between the first and second transmit and receive modules.

2. The system of claim 1, wherein the pick-and-place machine auxiliary is selected from the group consisting of: a feeder exchange system, a feeder, a feeder plate, a device for bar code verification of part numbers, an item of monitoring equipment, and an automatic nozzle changing device.

3. The system of claim 1, wherein the non-physical contact connection is an optical connection.

4. The system of claim 3, wherein the optical connection is a beam of infrared light.

5. The system of claim 3, wherein the optical connection is a beam of visible light.

6. The system of claim 1, wherein the non-physical contact connection is by RF radiation.

7. The system of claim 1, wherein the first transmit and receive module is configured to transmit data corresponding to a signal from the control system of the pick-and-place machine auxiliary to the second transmit and receive module.

8. The system of claim 7, wherein the pick-and-place machine auxiliary is a feeder exchange system or feeder, and wherein the signal from the control system of the pick-and-place machine auxiliary comprises at least one of a feeder ready signal, component identity information, and component usage information.

9. The system of claim 1, wherein the second transmit and receive module is configured to transmit data corresponding to a signal from the control system of the pick-and-place machine to the first transmit and receive module.

10. The system of claim 9, wherein the pick-and-place machine auxiliary is a feeder exchange system or feeder, and wherein the signal from the control system of the pick-and-place machine comprises a feeder trigger signal.

11. The system of claim 1, wherein the physical connection of the first transmit and receive module to the control system of the pick-and-place machine auxiliary comprises a multiplexer.

12. The system of claim 1, wherein the physical connection of the second transmit and receive module to the control system of the pick-and-place machine comprises a demultiplexer.

* * * * *